(12) United States Patent
Berchtold et al.

(10) Patent No.: US 9,339,885 B2
(45) Date of Patent: May 17, 2016

(54) METHOD AND APPARATUS FOR DISPENSING FLUX-FREE SOLDER ON A SUBSTRATE

(71) Applicant: Besi Switzerland AG, Cham (CH)

(72) Inventors: Heinrich Berchtold, Luzern (CH); Rene Betschart, Schwyz (CH)

(73) Assignee: Besi Switzerland AG, Cham (CH)

( * ) Notice: Subject to any disclaimer, the term of this patent is extended or adjusted under 35 U.S.C. 154(b) by 102 days.

(21) Appl. No.: 13/916,079

(22) Filed: Jun. 12, 2013

(65) Prior Publication Data

US 2014/0008421 A1  Jan. 9, 2014

(30) Foreign Application Priority Data

Jul. 5, 2012  (CH) .................................... 1044/12

(51) Int. Cl.
*B23K 3/06* (2006.01)
*B23K 1/20* (2006.01)
(Continued)

(52) U.S. Cl.
CPC . *B23K 3/063* (2013.01); *B23K 1/06* (2013.01); *B23K 1/20* (2013.01); *B23K 3/025* (2013.01); *H01L 23/49513* (2013.01); *H01L 24/03* (2013.01); *H01L 24/27* (2013.01); *H01L 24/743* (2013.01); *B23K 20/10* (2013.01); *H01L 24/29* (2013.01); *H01L 24/32* (2013.01); *H01L 24/83* (2013.01); *H01L 2224/0381* (2013.01); *H01L 2224/04026* (2013.01);
(Continued)

(58) Field of Classification Search
USPC ........................................... 228/41, 244, 253
See application file for complete search history.

(56) References Cited

U.S. PATENT DOCUMENTS 4,577,398 A  3/1986  Sliwa et al.
4,709,849 A  12/1987  Socolowski
(Continued)

FOREIGN PATENT DOCUMENTS

DE  196 19 771  8/1997
EP  2 384 841 A2  11/2011
(Continued)

OTHER PUBLICATIONS

French Preliminary Search Report in French Patent Application No. 1355167, dated Jul. 24, 2014.
(Continued)

*Primary Examiner* — Devang R Patel
(74) *Attorney, Agent, or Firm* — Nixon Peabody LLP

(57) ABSTRACT

An apparatus for dispensing flux-free solder comprises a dispenser head with a stamp to which ultrasound can be applied. Solder is dispensed by:
A) moving the dispenser head above a next substrate place,
B) lowering the stamp until the working surface of the stamp touches the substrate place or is located at a predetermined height above the substrate place,
C) dispensing solder by:
   C1) advancing the solder wire until the solder wire touches the substrate place, in such a manner that the tip of the solder wire touches the substrate place within a recess of the stamp,
   C2) further advancing of solder wire to melt a predetermined quantity of solder, and
   C3) retracting the solder wire,
D) moving the dispenser head to distribute the solder on the substrate place, and simultaneously applying ultrasound to the stamp, and
E) raising the stamp.

8 Claims, 2 Drawing Sheets

Figure 1:
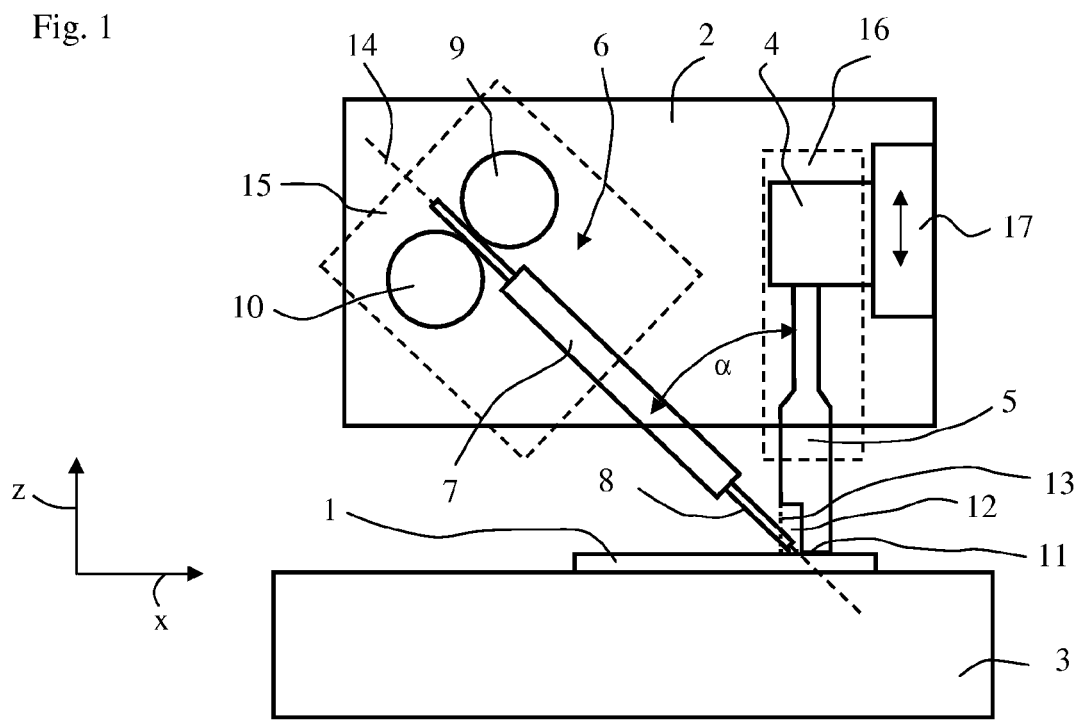

(51) Int. Cl.
  *B23K 1/06* (2006.01)
  *B23K 3/02* (2006.01)
  *H01L 23/00* (2006.01)
  *H01L 23/495* (2006.01)
  *B23K 20/10* (2006.01)

(52) U.S. Cl.
  CPC ............... *H01L 2224/2731* (2013.01); *H01L 2224/2733* (2013.01); *H01L 2224/27334* (2013.01); *H01L 2224/2919* (2013.01); *H01L 2224/32245* (2013.01); *H01L 2224/83192* (2013.01); *H01L 2224/83801* (2013.01); *H01L 2924/00011* (2013.01); *H01L 2924/3841* (2013.01)

(56) References Cited

U.S. PATENT DOCUMENTS

| | | | |
|---|---|---|---|
| 4,898,117 A * | 2/1990 | Ledermann et al. | 118/665 |
| 5,421,504 A * | 6/1995 | Spirig | 228/41 |
| 5,878,939 A | 3/1999 | Luchinger et al. | |
| 6,056,184 A | 5/2000 | Luchinger et al. | |
| 6,744,003 B1 * | 6/2004 | Ono | 219/85.16 |
| 7,735,715 B2 * | 6/2010 | Lam et al. | 228/180.21 |
| 8,777,087 B2 * | 7/2014 | Von Campe et al. | 228/110.1 |
| 2004/0035907 A1 * | 2/2004 | Radeck | 228/41 |
| 2009/0140028 A1 * | 6/2009 | Forti et al. | 228/118 |
| 2009/0145950 A1 | 6/2009 | Lam et al. | |
| 2011/0272453 A1 * | 11/2011 | Von Campe et al. | 228/205 |
| 2012/0298730 A1 * | 11/2012 | Berchtold | 228/262 |

FOREIGN PATENT DOCUMENTS

| | | | |
|---|---|---|---|
| GB | 1 352 558 | | 5/1974 |
| JP | 64-50595 A | | 2/1989 |
| JP | 7-45646 A | | 2/1995 |
| JP | 2004-214354 | | 7/2004 |
| JP | 2008-296265 A | | 12/2008 |
| JP | 2011-51007 A | | 3/2011 |
| JP | 2011051007 A | * | 3/2011 |
| WO | 01/89753 | | 11/2001 |

OTHER PUBLICATIONS

Search Report in Singapore Patent Application No. 201304184-3, mailed Aug. 4, 2014.

* cited by examiner

METHOD AND APPARATUS FOR DISPENSING FLUX-FREE SOLDER ON A SUBSTRATE

PRIORITY CLAIM

Applicant hereby claims foreign priority under 35 U.S.C. §119 from Swiss Patent Application No. 1044/12 filed Jul. 5, 2012, the disclosure of which is herein incorporated by reference.

FIELD OF THE INVENTION

The invention relates to a method and apparatus for dispensing flux-free solder on a substrate.

BACKGROUND OF THE INVENTION

Soldering methods of this kind are typically but not exclusively used in the mounting of semiconductor chips on a metallic substrate, a so-called leadframe. Power semiconductors are usually mainly connected by means of soft soldering with the substrate, which usually consists of copper, in order to ensure a more effective dissipation of the heat losses from the semiconductor chip via the soldered joint in comparison with mounting by means of an adhesive. High requirements are placed on the homogeneity of the soldered joint, especially in the case of increased power density, i.e. a defined thickness, even distribution and perfect wetting of the solder layer over the entire chip area as well as complete freedom from bubbles and purity of the soldered joint are demanded. On the other hand, the solder should not escape laterally from the soldering gap and spread next to the semiconductor chip, which again requires precise dosing and positioning of the solder portions.

In the field of mounting semiconductor chips a method is widely spread in practical use in which the end of a solder wire is brought into contact with the substrate that his heated over the melting temperature of the solder in order to melt down a piece of the wire. This method is generally well suited for mass production due to its simplicity and flexibility. However, the obtained approximately circular wetting surface is badly adapted to the rectangular or square shape of the semiconductor chips. A punching die is further known from U.S. Pat. No. 6,056,184 with which the portion of solder deposited on the substrate can be brought into a flat shape which is adjusted to the rectangular shape of the semiconductor chips. It is also known to move the end of the soldering metal wire with a writing head along a specific path, with the heated substrate continuously melting down the solder. A track of solder is thereby deposited on the substrate.

From U.S. Pat. No. 5,878,939 a method is known in which liquid solder is injected into a cavity formed between a molding die and the substrate.

These known methods come with a number of disadvantages. The shape of the deposited solder is either round or a specific punching die needs to be produced for every rectangular shape. Such a punching die comprises side walls which cover a part of the substrate. The solder can therefore not be applied up to the edge of the chip island which accommodates the semiconductor chip. Moreover, the substrate needs to be heated up over the melting temperature of the solder and the deposited solder needs to be kept in liquid form from the application until the placement of the semiconductor chip. It is also disadvantageous that the parts that come into contact with the liquid solder need to be cleaned regularly, for which purpose production needs to be interrupted.

From U.S. Pat. No. 4,577,398 and U.S. Pat. No. 4,709,849 a method is known in which flat preforms made of soldering metal (so-called "solder preforms") are prefabricated, the dimensions of which are adjusted to the semiconductor chips. The solder preforms are then placed on the substrate and molten down by the same in order to form a soldering layer in the required dimensions. This method is relatively expensive and offers little flexibility due to the required prefabrication of the solder preforms and the additional mounting operations.

From US 2009-145950 a method and apparatus are known in which a solder wire is guided through the writing head of a solder dispenser, with the wire being brought into contact with the heated substrate when applying the solder, so that the solder will melt at the end of the wire, and with the writing head being moved along a predetermined path parallel to the surface of the substrate. The solder dispenser writes a solder track in this manner on the substrate. It is disadvantageous in this method that the substrate can only be wetted insufficiently without preceding cleaning.

SUMMARY OF THE INVENTION

The invention is based on the object of developing a method and apparatus for the application of flux-free solder to a substrate which no longer shows the mentioned disadvantages.

The method according to the invention for dispensing flux-free solder onto substrate places of a substrate uses a dispensing apparatus comprising a dispenser head which comprises a stamp, an ultrasonic head configured to apply ultrasound to the stamp and a wire feed. The stamp has a working surface which has a recess open to a lateral surface of the stamp. The wire feed feeds the solder wire under an angle diagonally to the surface of the substrate. The method comprises the following steps:

A) moving the dispenser head to a predetermined position above the next substrate place onto which solder is to be dispensed, B) lowering the stamp until B1) the working surface of the stamp touches the substrate place, or B2) the working surface of the stamp is located at a predetermined height above the substrate place, or B3) the working surface of the stamp touches the substrate place, and raising the stamp to a predetermined height above the substrate place, wherein the height mentioned in B2 and B3 is set in such a manner that the working surface of the stamp is wetted with solder in the later following step D, C) dispensing flux-free solder to the substrate place by:

C1) advancing the solder wire until the solder wire touches the substrate place, in such a manner that the tip of the solder wire touches the substrate place within the recess of the stamp, C2) further advancing of solder wire, in order to melt a predetermined quantity of solder, and C3) retracting the solder wire, D) moving the dispenser head along a predetermined path in order to distribute the solder on the substrate place, and simultaneously applying ultrasound to the stamp, and E) raising the stamp, wherein step D is carried out either after step C3 or already begins during step C2.

The method preferably further comprises feeding the solder wire through a nozzle and actively cooling the nozzle.

According to the invention, an apparatus for dispensing flux-free solder onto substrate places of a substrate comprises
a dispenser head, which is movable in two horizontal directions, and, optionally, in the vertical direction, comprising
an ultrasonic head,
a stamp having a working surface, which has a recess open toward a lateral surface of the stamp, wherein the stamp is fastenable on the ultrasonic head,
a wire feed having a nozzle having a longitudinal borehole, through which the solder wire can be guided, wherein a longitudinal axis of the wire feed, which extends through the longitudinal borehole of the nozzle, enters at the lateral surface of the stamp into the recess and is incident on the substrate within a part of the working surface bounded by the recess, and
a cooling device, which is configured to keep the working temperature of the stamp at a predetermined temperature.

The apparatus preferably further comprises a further cooling device for cooling the nozzle of the wire feed.

The apparatus preferably further comprises a drive fastened on the dispenser head, which is configured to move the ultrasonic head with the stamp up and down in the vertical direction.

Preferably, the recess of the stamp is coated with a material which poorly wets flux-free solder.

BRIEF DESCRIPTION OF THE DRAWING FIGURES

Figure 2:
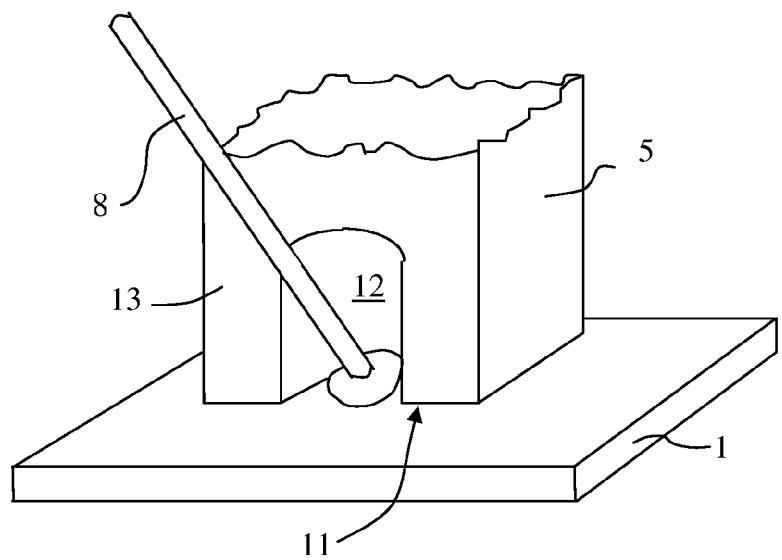
Figure 3:
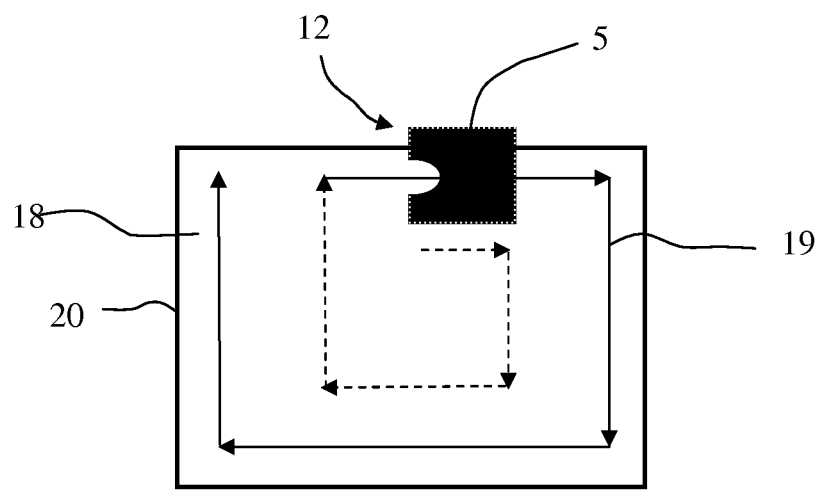

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 schematically shows a side view of a dispenser head of a dispensing station of a machine for soldering semiconductor chips on a substrate, FIG. 2 shows a stamp, and FIG. 3 shows a path, which the stamp covers on a substrate place.

DETAILED DESCRIPTION OF THE INVENTION

FIG. 1 schematically shows a side view of those parts of a dispensing station of a machine for soldering semiconductor chips on a substrate which are required for understanding the invention. The dispensing station comprises an apparatus for applying flux-free solder onto the individual substrate places of a substrate 1. The substrate 1 rests on a heatable support 3. The apparatus comprises a dispenser head 2, which is movable in two horizontal directions, designated with x and y, and, optionally, can be raised and lowered in the vertical direction, designated with z. The dispenser head 2 comprises an ultrasonic head 4, on which a stamp 5 is removably fastened, and a wire feed 6. The ultrasonic head 4 is configured to apply ultrasound to the stamp 5, preferably longitudinal ultrasonic waves, which run in the z direction, i.e. their oscillation direction is directed perpendicularly to the support 3. The frequency of the ultrasonic waves is preferably in the range from 40 kHz to 200 kHz, typically at approximately 60 kHz. The processing of the substrate 1 with ultrasound improves the wetting ability locally on the surface on which the solder is desired, and thus reduces the undesired running over of the solder, which is known in technical jargon as "solder bleed out".

The wire feed 6 comprises a nozzle 7, e.g., a capillary made of ceramic, having a longitudinal borehole, through which the solder wire 8 is guided, and drive means, in order to advance and retract the solder wire 8. The drive means comprise, for example, a drive roller 9 driven by a motor and a counter pressure roller 10, between which the solder wire 8 is guided through. The solder wire 8 is typically wound onto a roll, which is either arranged in a stationary manner on the dispensing station or is arranged on the dispenser head 2.

The stamp 5 has a working surface 11 facing toward the substrate 1, which is used to distribute the solder. The stamp 5 is implemented with a recess 12, which leads from a lateral surface 13 of the stamp 5 facing toward the wire feed 6 to the working surface 11 and therefore opens into the working surface 11. The nozzle 7 is aligned diagonally to the vertical at a predetermined angle α and is arranged in such a manner that a longitudinal axis 14 of the wire feed 6, which extends through the longitudinal borehole of the nozzle 7, enters at the lateral surface 13 of the stamp 5 into the recess 12 and is incident on the substrate 1 within the part of the working surface 11 bounded by the recess 12.

FIG. 2 shows the stamp 5 placed on a substrate 1 in a perspective view. It can be seen clearly therein that the solder wire 8 is incident on the substrate 1 within the recess 12 of the stamp 5, and since the temperature of the substrate 1 is higher than the melting temperature of the solder, the end of the solder wire 8 melts. As a result of the formation of the stamp 5 of the dispenser head 2 with the recess 12 and the diagonal feed of the solder wire 8, the tip of the solder wire 8 touches the substrate place within the recess 12 of the dispenser head 2. The solder wire 8 does not touch the stamp 5: the melting of solder therefore occurs due to the contact with the hot substrate 1 and not due to contact with the stamp 5. The recess 12 of the stamp 5 therefore represents, as can be clearly seen in FIG. 2, a cavity which is open toward the wire feed 6 and toward the working surface 11. The cavity is bounded on the side facing toward the substrate 1 on three sides and is only open toward the wire feed 6.

The stamp 5 or at least its working surface 11 preferably consists of a copper alloy such as brass or bronze, or of a silver-copper alloy having a high proportion of silver and a low proportion of copper, which the flux-free solder wets well. The surface of the stamp 5 delimited by the recess 12 can be coated with a material which is poorly wettable with solder. Chromium is such a material, for example. This prevents solder from adhering to the inner side of the recess 12, which could have the result that the quantity of solder delivered is not always equal. The outer side of the stamp 5 can also be coated with such a material.

The dispenser head 2 preferably has a first cooling device 15 (FIG. 1), which ensures that the temperature of the solder wire 8 within the nozzle 7 is below the melting temperature of the solder and the solder wire 8 remains sufficiently stiff to be able to be advanced or retracted by the drive means.

The temperature of the support 3 and therefore also the temperature of the substrate 1 are above the melting temperature of the solder. Essential parts of the apparatus protrude additionally into a nearly closed chamber (a furnace), in which typically a $N_2H_2$ atmosphere prevails, in order to reduce oxides formed on the substrate.

The melting temperature of flux-free solders is typically in a range of 300 to 320° C. The support 3 is heated to a temperature above this, typically of 360-380° C. A temperature of 360-380° C. then also prevails relatively rapidly in the furnace. These values are examples, they can deviate therefrom in the specific case.

The dispenser head 2 therefore preferably has a second cooling device 16 (FIG. 1), which is used for the purpose of keeping the temperature of the stamp 5 within a predetermined temperature window. The cooling device 16 is therefore configured to regulate the temperature of the stamp 5 to a predetermined working temperature. The working temperature is in the range of the melting temperature of the solder, typically within a processing window which extends from a few degrees Kelvin below the melting temperature up to a few degrees Kelvin above the melting temperature of the solder. Experiments have shown that a to low working temperature has the result that solder collects on the working surface of the stamp, which falls off of the stamp 5 from time to time, while a to high working temperature can result in erosion of the stamp 5. The cooling device 16 is used for the purpose of dissipating heat from the stamp 5, so that the working temperature of the stamp 5 remains within the predetermined temperature window, in which these effects do not occur or are at least greatly reduced.

The cooling device 16 can contain an integrated heater, which is used for the purpose of heating the stamp 5 to the working temperature before the beginning of the mounting process, on the one hand, and which is used for the purpose of regulating the temperature of the stamp 5 to the desired working temperature together with the cooling device 16, on the other hand.

Since the dispenser head 2 has a rather high mass and therefore also a relatively large inertia because of the diverse components, it is advantageous to attach a drive 17 on the dispenser head 2, which allows the ultrasonic head 4 with the stamp 5 to be moved up and down in the vertical direction, i.e., in the z direction. A voice coil detector, for example, is provided for detecting the point in time at which the stamp 5 comes into contact with the substrate 1 as it is lowered.

The method according to the invention for applying flux-free solder onto the substrate places of the substrate 1 comprises the following steps, for which purpose the above-described dispensing apparatus is used:

A) moving the dispenser head 2 to a predetermined position above the next substrate place onto which solder is to be dispensed, B) lowering the stamp 5 until B1) the working surface 11 of the stamp 5 touches the substrate place, or B2) the working surface 11 of the stamp 5 is located at a predetermined height above the substrate place, or B3) the working surface 11 of the stamp 5 touches the substrate place, and raising the stamp 5 to a predetermined height above the substrate place, wherein the height mentioned in B2 and B3 is set in such a manner that the working surface 11 of the stamp 5 is wetted with solder in the later following step D, C) dispensing flux-free solder to the substrate place by:

C1) advancing the solder wire 8 until the solder wire 8 touches the substrate place, in such a manner that the tip of the solder wire 8 touches the substrate place within the recess 12 of the stamp 5, C2) further advancing of solder wire 8, in order to melt a predetermined quantity of solder, and C3) retracting the solder wire 8, D) moving the dispenser head 2 along a predetermined path in order to distribute the solder on the substrate place, and simultaneously applying ultrasound to the stamp 5, and E) raising the stamp 5, wherein step D is carried out either after step C3 or already begins during step C2.

If steps C2 and D are carried out simultaneously, this means that the drive means continuously advance the solder wire 8 and solder is continuously melted off from its end. The predetermined path can be designed in such a manner that the stamp 5 partially protrudes beyond the edge of the substrate place. In this manner, the solder can completely cover the substrate place. The application of ultrasound to the stamp 5 causes the solder to be well wetted on the substrate place. In order to prevent solder from spraying away, the application of the solder advantageously begins in the center of the substrate place, so that it is very well wetted there and no longer flows away.

It is possible to vary the strength and the frequency of the ultrasonic waves according to a predetermined profile, in particular, single or multiple ultrasonic pulses (ultrasonic bursts) can be applied.

Since the solder wire 8 conducts heat extraordinarily well, it always absorbs heat when it is brought into contact with the substrate 1 in step C to deposit a solder portion, whereby the nozzle 7 and/or further components of the wire feed 6 heat up. The nozzle 7 is therefore actively cooled by the cooling device 15 if necessary, so that the temperature of the solder wire 8 remains below its melting temperature and the solder wire 8 remains sufficiently stiff to be able to be pushed out of the nozzle 7 and retracted back into the nozzle 7 by the drive without problems.

In many applications, the semiconductor chip is mounted on a substrate place 18, whose dimensions are approximately equal to the dimensions of the semiconductor chip. The substrate is typically a so-called lead frame. The substrate place 18 is connected via thin webs (not shown) to the frame of the lead frame. The solder portion must then typically cover the entire substrate place 18. To achieve this, it is advantageous to move the stamp 5 along a path 19, which leads at least partially along the edge 20 of the substrate place 18 and is determined in such a manner that the working surface 11 of the stamp 5 protrudes beyond the edge 20 and therefore only still partially touches the substrate place 18. FIG. 3 illustrates this. Those parts of the path 19 in which the working surface 11 of the stamp 5 protrudes beyond the edge 20 are shown by solid arrows, the remaining parts of the path 19 are shown by dashed arrows. The path 19 begins in the center or close to the center of the substrate place 18 and then first leads along path sections located in the interior of the substrate place 18 step-by-step outward until it finally leads along the edge 20 of the substrate place 18. In other words, the path 19 leads from the inside to the outside. Since in the case of such a path 19, firstly the regions of the substrate place 18 located in the interior are treated with ultrasound, the solder wets well there, so that as a result no solder is sprayed away from the substrate place 18. The path 19 is only shown as an example here, it can also be composed of other path sections. In this example, the outline of the working surface 11 of the stamp 5 is square, however, it can also be rectangular or round or have any arbitrary other shape. It is advantageous in the case of certain applications to move the stamp 5 at the starting point of the path 19 in the direction which is opposite to the lateral surface 13 having the recess 12. As a result of the capillary effect, the molten solder is nonetheless distributed.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. A method for dispensing flux-free solder onto substrate places of a substrate by means of a dispensing apparatus comprising a dispenser head which comprises a stamp, an ultrasonic head configured to apply ultrasound to the stamp and a wire feed, wherein the stamp has a working surface which has a recess open to a lateral surface of the stamp, wherein the wire feed feeds the solder wire under an angle diagonally to the surface of the substrate, and wherein a heatable support heats the substrate to a temperature above the melting temperature of the solder, the method comprising the following steps:
   A) moving the dispenser head to a predetermined position above the next substrate place onto which solder is to be dispensed,
   B) lowering the stamp until
      B1) the working surface of the stamp touches the substrate place, or
      B2) the working surface of the stamp is located at a predetermined height above the substrate place, or
      B3) the working surface of the stamp touches the substrate place, and raising the stamp to a predetermined height above the substrate place,
   wherein the height mentioned in B2 and B3 is set in such a manner that the working surface of the stamp is wetted with solder in the later following step D,
   C) dispensing flux-free solder to the substrate place by:
      C1) advancing the solder wire until the solder wire touches the substrate place, in such a manner that the tip of the solder wire touches the substrate place within the recess of the stamp without the solder wire touching the stamp,
      C2) further advancing of solder wire, in order to melt a predetermined quantity of solder due to the contact with the substrate, and
      C3) retracting the solder wire,
   D) moving the dispenser head along a predetermined path in order to distribute the solder on the substrate place, and simultaneously applying ultrasound to the stamp, and
   E) raising the stamp, wherein
   step D is carried out either after step C3 or already begins during step C2.

2. The method according to claim 1, further comprising feeding the solder wire through a nozzle and actively cooling the nozzle.

3. The method according to claim 1, wherein a starting point of the path is located at or near a center of the substrate place, and the path then first leads along path sections located in an interior of the substrate place outward until the path leads along an edge of the substrate place.

4. The method according to claim 2, wherein a starting point of the path is located at or near a center of the substrate place, and the path then first leads along path sections located in an interior of the substrate place outward until the path leads along an edge of the substrate place.

5. The method according to claim 1, wherein the recess of the stamp is coated with a material which poorly wets flux-free solder.

6. The method according to claim 2, wherein the recess of the stamp is coated with a material which poorly wets flux-free solder.

7. The method according to claim 3, wherein the recess of the stamp is coated using a material which flux-free solder wets poorly.

8. The method according to claim 4, wherein the recess of the stamp is coated using a material which flux-free solder wets poorly.

* * * * *